United States Patent
Cho et al.

(10) Patent No.: US 7,495,961 B2
(45) Date of Patent: Feb. 24, 2009

(54) SENSE AMPLIFIERS INCLUDING MULTIPLE PRECHARGE CIRCUITS AND ASSOCIATED MEMORY DEVICES

(75) Inventors: Ji-ho Cho, Suwon-si (KR); Sang-wan Nam, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/563,746

(22) Filed: Nov. 28, 2006

(65) Prior Publication Data

US 2008/0112229 A1    May 15, 2008

(30) Foreign Application Priority Data

Oct. 31, 2006  (KR)  .................... 10-2006-0105973

(51) Int. Cl.
*G11C 11/34* (2006.01)
(52) U.S. Cl. ............................. 365/185.21; 365/185.18
(58) Field of Classification Search ............ 365/185.21, 365/185.18
See application file for complete search history.

(56) References Cited

U.S. PATENT DOCUMENTS

| | | | | |
|---|---|---|---|---|
| 4,758,748 A * | 7/1988 | Takeuchi | ............... | 365/185.21 |
| 4,926,379 A * | 5/1990 | Yoshida | ................. | 365/185.21 |
| 5,012,448 A * | 4/1991 | Matsuoka et al. | ........... | 365/208 |
| 5,022,009 A * | 6/1991 | Terada et al. | ............ | 365/185.21 |
| 5,056,063 A * | 10/1991 | Santin et al. | ........... | 365/185.21 |
| 5,168,466 A * | 12/1992 | Kuo et al. | .............. | 365/185.21 |
| 5,198,997 A * | 3/1993 | Arakawa | ................ | 365/185.21 |
| 5,353,249 A * | 10/1994 | Itano | ..................... | 365/185.25 |
| 5,388,069 A * | 2/1995 | Kokubo | ................... | 365/185.3 |
| 5,388,078 A * | 2/1995 | Arakawa | ..................... | 365/203 |
| 5,396,467 A * | 3/1995 | Liu et al. | ..................... | 365/210 |
| 5,524,097 A * | 6/1996 | Lee | ........................ | 365/185.21 |
| 6,191,979 B1 | 2/2001 | Uekubo | | |
| 6,490,199 B2 * | 12/2002 | Lee et al. | ............... | 365/185.21 |
| 6,510,082 B1 * | 1/2003 | Le et al. | ................ | 365/185.16 |
| 6,888,756 B2 | 5/2005 | Byeon et al. | | |

FOREIGN PATENT DOCUMENTS

| | | |
|---|---|---|
| JP | 2000-100186 A | 4/2000 |
| KR | 2002-0064576 B1 | 8/2002 |
| KR | 10-2003-0072434 B1 | 9/2003 |

* cited by examiner

*Primary Examiner*—Hoai V Ho
*Assistant Examiner*—Fernando N Hidalgo
(74) *Attorney, Agent, or Firm*—Myers Bigel Sibley & Sajovec, P.A.

(57) ABSTRACT

A sense amplifier of a flash memory device maintains a bit line precharge level before a memory cell is sensed. The sense amplifier maintains the voltage of a bias signal sufficiently high using a second precharging circuit in a precharging operation to stably maintain the bit line precharge level set by a first precharging circuit. Accordingly, the sense amplifier can correctly sense an OFF cell using the stabilized bit line precharge voltage. Related methods and memory devices are also disclosed.

8 Claims, 4 Drawing Sheets

US 7,495,961 B2

SENSE AMPLIFIERS INCLUDING MULTIPLE PRECHARGE CIRCUITS AND ASSOCIATED MEMORY DEVICES

CROSS-REFERENCE TO RELATED PATENT APPLICATION

This application claims the benefit under 35 USC §119 of Korean Patent Application No. 10-2006-0105973, filed on Oct. 31, 2006, the disclosure of which is hereby incorporated by reference in its entirety as if set forth fully herein.

FIELD OF THE INVENTION

The present invention relates to memory devices such as flash memory devices, and, more particularly, to sense amplifiers and sensing methods.

BACKGROUND OF THE INVENTION

A flash memory device includes electrically erasable and programmable memory cells. The memory cells are composed of floating gate transistors. A floating gate transistor generally includes source and drain regions formed in a substrate, a floating gate on a channel region disposed between the source and drain regions, a control gate on the floating gate and an insulating layer between the floating gate and the control gate. The electrically erasable and programmable memory cells of the flash memory device may be programmed by hot electron injection to an OFF state. The programmed memory cells may be erased by tunneling to an ON state. As is also well known, flash memory devices may be classified into NAND and NOR type devices.

A flash memory device, such as a NOR type flash memory device, generally employs a sense amplifier in order to sense whether a memory cell is in an ON state or an OFF state. FIG. 1 is a circuit diagram of a conventional flash memory device 100 including a sense amplifier.

Referring to FIG. 1, the flash memory device 100 includes a memory cell 110 connected to a bit line B/L, a column select circuit 120 connected between the bit line B/L and a data line D/L, and a sense amplifier 130 connected to the data line D/L. The memory cell 110 is connected between the bit line B/L and a ground voltage source VSS and configured in the form of a floating gate transistor having a control gate connected to a word line W/L. The column select circuit 120 connects the bit line B/L to the data line D/L in response to a column address decoding signal YA. It will be understood that FIG. 1 only illustrates a single memory cell 110, but, conventionally, a large number of flash memory cells are provided in an integrated circuit flash memory device.

The sense amplifier 130 includes a first inverter 131 receiving a sense amplifier enable signal SAE and outputting a bias signal BIAS, a first NMOS transistor 133 having a gate receiving the bias signal BIAS and a source connected to the data line D/L, a second NMOS transistor 135 having a drain receiving the bias signal BIAS and a gate connected to the data line D/L, a first PMOS transistor 137 having a source provided with a power supply voltage VCC, a gate receiving a precharge signal PRE, and a drain connected to a node NA corresponding to the drain of the NMOS transistor 133. The sense amplifier 130 also includes a second PMOS transistor 139 having a source provided with the power supply voltage VCC and a gate receiving the precharge signal PRE, a third NMOS transistor 141 having a source connected to the drain of the second PMOS transistor 139, a gate receiving the bias signal BIAS, and a drain connected to the data line D/L, and a second inverter 143 receiving a signal of the node NA and outputting a sense amplifier output signal SAOUT.

The operation of the sense amplifier 130 will be explained with reference to FIGS. 1 and 2. FIG. 2 is a timing diagram of the operation of the sense amplifier 130. Referring to FIGS. 1 and 2, the bias signal BIAS transitions to a logic high level when the sense amplifier enable signal SAE is enabled by transitioning to a logic low level, as shown at (a). The bias signal BIAS at a logic high level turns on the first and third NMOS transistors 133 and 141. When the precharge signal PRE is enabled by transitioning to a logic low level in a precharging operation, the first PMOS transistor 137 is turned on. Accordingly, the node NA, the data line D/L and the bit line B/L are precharged to a logic high level, as shown at (b). When the word line WL is enabled to a logic high level, the state of the memory cell 110, that is, whether the memory cell 100 is an ON cell or an OFF cell, is sensed by determining the voltage of the bit line B/L. The bit line B/L has a ground voltage when the memory cell 110 is an ON cell and the bit line B/L has a predetermined voltage, for example, 0.6V, when the memory cell 110 is an OFF cell.

A coupling effect wherein the node NA that is precharged to a logic high level in a precharging operation may increase the voltage of the bias signal BIAS. Accordingly, the voltage of the data line D/L and the voltage of the bit line B/L may also increase, as shown at (c). When the voltage of the data line D/L increases, the second NMOS transistor 135 is turned on to decrease the voltage of the bias signal BIAS, as shown at (d). Accordingly, the current flowing through the first and second NMOS transistors 133 and 141 may be reduced, and thus the voltage of the bit line B/L may not be sufficiently precharged.

When the memory cell 110 is an ON cell in the next sensing operation, the bit line B/L has a ground voltage VSS based on a turned on memory cell transistor, and thus the ON cell is correctly sensed. However, when the memory cell 110 is an OFF cell, the OFF cell may be sensed as an ON cell due to the voltage of the bit line B/L, which may not be sufficiently precharged.

SUMMARY OF THE INVENTION

Sense amplifiers according to some embodiments of the invention comprise a first inverter that is responsive to a sense amplifier enable signal and that is configured to output a bias signal. A first precharging unit is configured to precharge a first node and a second node in response to a first precharge signal. A second precharging unit is configured to precharge the bias signal in response to a second precharge signal. A switching unit is configured to connect the first and second nodes to a data line in response to the bias signal. A feedback unit is configured to control the bias signal to maintain a voltage of the data line and a voltage of a bit line. A second inverter is responsive to the first node and is configured to output a sense amplifier output signal.

The first precharging unit may comprise a first PMOS transistor having a source and a drain that are connected between a power supply voltage and the first node, and a gate responsive to the first precharge signal, and a second PMOS transistor having a source and a drain that are connected between the power supply voltage and the second node and a gate responsive to the first precharge signal.

The second precharging unit may comprise a PMOS transistor having a source and a drain that are connected between the power supply voltage and the bias line and a gate responsive to the second precharge signal.

The switching unit may comprise a first NMOS transistor having a source and a drain that are connected between the data line and the first node and a gate responsive to the bias signal and a second NMOS transistor having a source and a drain that are connected between the data line and the second node and a gate responsive to the bias signal.

The feedback unit may comprise an NMOS transistor having a source and drain that are connected between the bias signal and a ground voltage and a gate responsive to the data line.

According to other embodiments of the invention, any of the above-described sense amplifiers may be incorporated into a flash memory device. These flash memory devices comprise a plurality of flash memory cells, bit lines respectively connected to the plurality of flash memory cells, a column select circuit connecting one of the plurality of bit lines to a data line and a sense amplifier according to any of the above-described embodiments. The sense amplifier may be configured to precharge the data line and the bit line in response to first and second precharge signals, sense whether a flash memory cell is an ON cell or an OFF cell in response to a sense amplifier enable signal, and generate a sense amplifier output signal.

The flash memory device may be a NOR type flash memory device.

Other embodiments of the present invention provide methods of sensing a memory cell of a memory device, such as a flash memory device. These methods comprise precharging first and second nodes to a first voltage in response to a first precharge signal, precharging a bias signal to the first voltage in response to activation of a sense amplifier enable signal and a second precharge signal, maintaining the precharged bias signal during an activation period of the second precharge signal, precharging a data line connected to the first and second nodes to the first voltage and precharging a bit line connected to the memory cell to a second voltage in response to the precharged bias signal and enabling a word line connected to the memory cell during an activation period of the sense amplifier enable signal and sensing the voltages of the bit line and the data line in response to whether the memory cell is an ON cell or an OFF cell.

The first voltage may correspond to a power supply voltage and the second voltage may be lower than the power supply voltage.

Sense amplifiers according to other embodiments of the present invention comprise a circuit that includes a plurality of transistors that are configured to precharge first and second nodes to a first voltage in response to a first precharge signal, to precharge a bias signal to the first voltage in response to activation of a sense amplifier enable signal and a second precharge signal, and to precharge a data line connected to the first and second nodes to the first voltage and precharge a bit line connected to the memory cell to a second voltage in response to the precharged bias signal. In other embodiments, the circuit is further configured to maintain the precharged bias signal during an activation period of the second precharge signal. In still other embodiments, the circuit is configured to enable a word line connected to the memory cell during an activation of the sense amplifier enable signal, and sense the voltages of the bit line and the data line in response to whether the memory cell is an ON cell or an OFF cell.

Accordingly, some embodiments of the invention can provide sense amplifiers and sensing methods that maintain the voltage of the bias signal sufficiently high using the second precharging unit in a precharging operation, so that two precharging units can stably maintain the bit line precharge level set by the first precharging unit. Therefore, the sense amplifier can correctly sense an OFF cell using the stabilized bit line precharge voltage.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
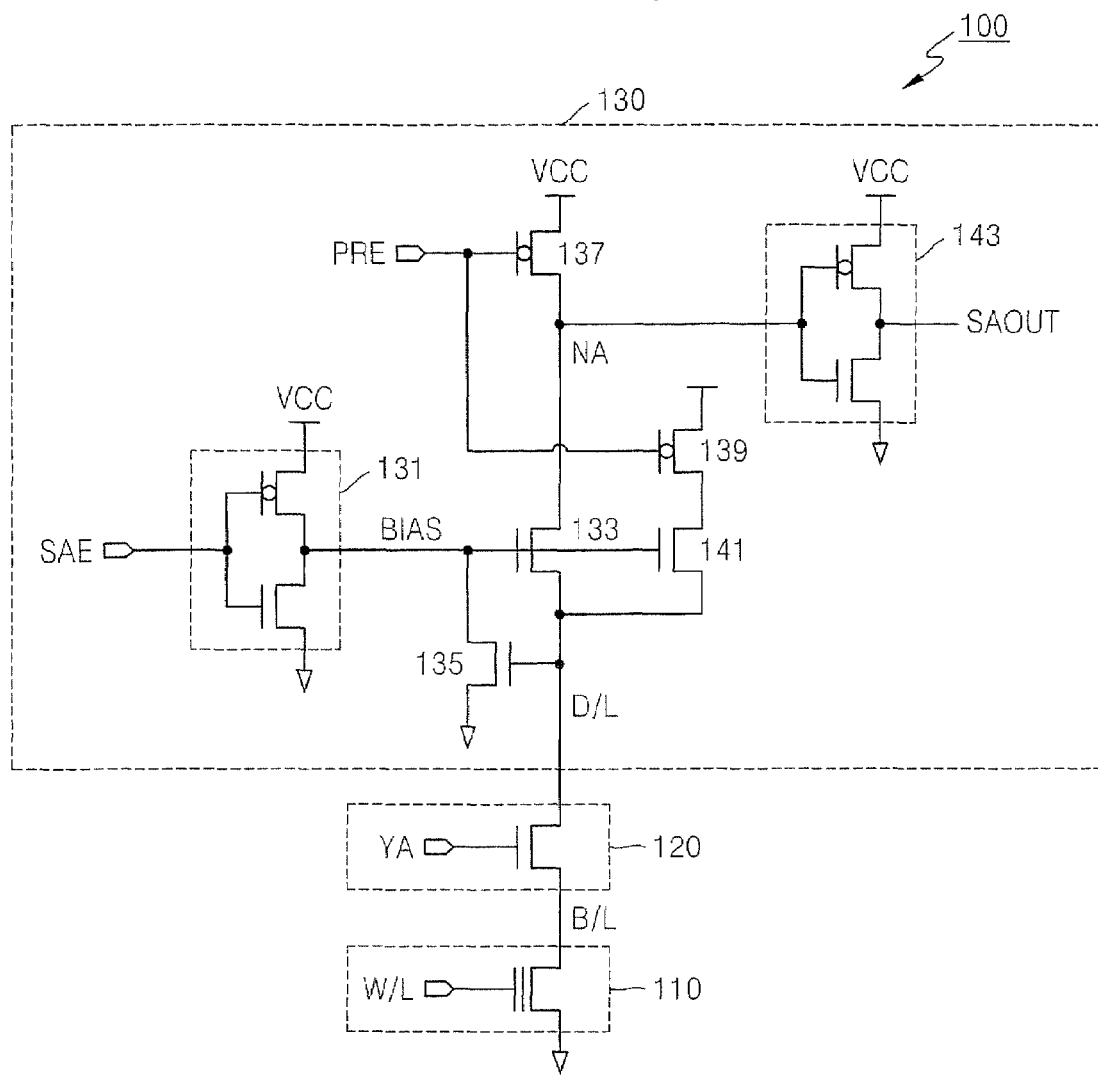
FIG. 1 is a circuit diagram of a sense amplifier of a conventional flash memory device.
Figure 2:
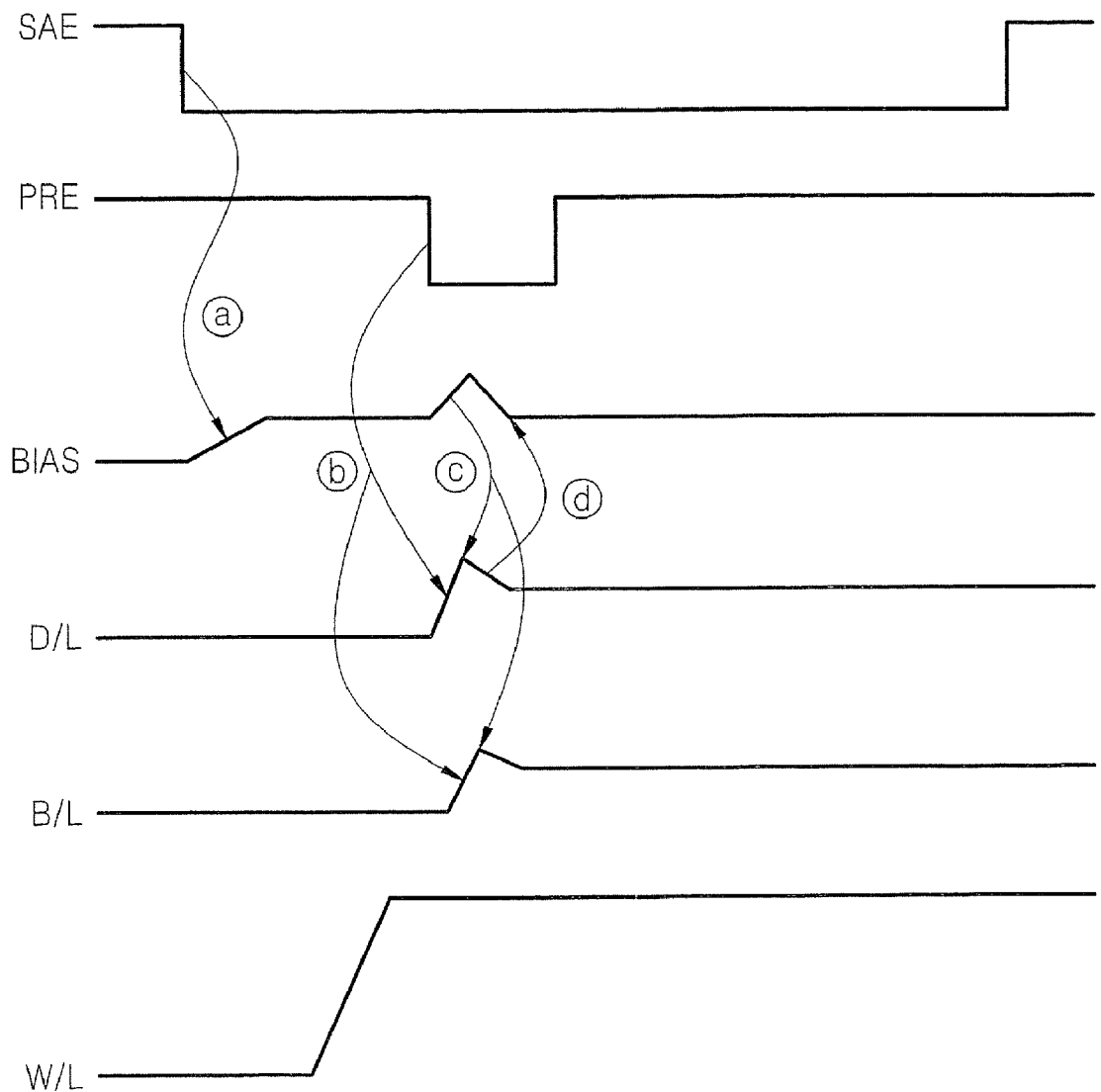
FIG. 2 is a timing diagram of the operation of the sense amplifier illustrated in FIG. 1.

The present invention is described more fully hereinafter with reference to the accompanying drawings, in which example embodiments of the invention are shown. The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art. Moreover, each embodiment described and illustrated herein includes its complementary conductivity type embodiment as well.

It will be understood that when an element is referred to as being "connected to," "coupled to" or "responsive to" (and/or variants thereof another element, it can be directly connected, coupled or responsive to the other element or intervening elements may be present. In contrast, when an element is referred to as being "directly connected to," "directly coupled to" or "directly responsive to" (and/or variants thereof another element, there are no intervening elements present. Like numbers refer to like elements throughout. As used herein, the term "and/or" includes any and all combinations of one or more of the associated listed items and may be abbreviated as "/".

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention. Similarly, the terms "source" and "drain" are used to distinguish first and second controlling electrodes of a field effect transistor, so that the designation of "source" and "drain" should not be viewed as limiting. Thus, a source could be termed a drain and vice versa without departing from the teachings of the present invention.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising" (and/or variants thereof), when used in this specification, specify the presence of stated features, integers, steps, operations, elements, and/or components, but do not preclude the presence or addition of one or more other features, integers, steps, operations, elements, components, and/or groups thereof. In contrast, the term "consisting of" (and/or variants thereof) when used in this specification, specifies the stated number of features, integers, steps, operations, elements, and/ or components, and precludes additional features, integers, steps, operations, elements, and/or components.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and the present application, and will not be interpreted in an idealized or overly formal sense unless expressly so defined herein.

Figure 3:
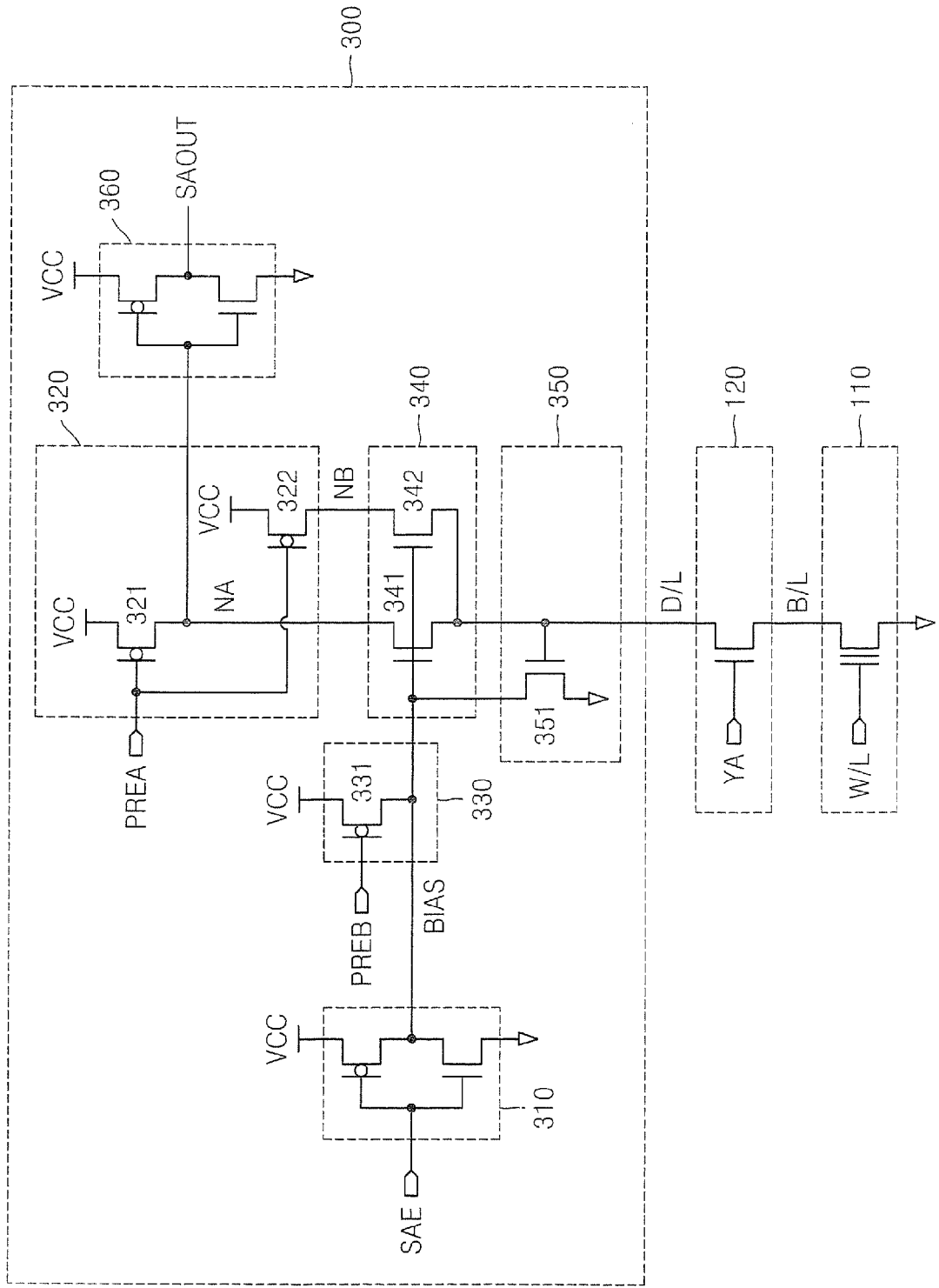
FIG. 3 is a circuit diagram of a sense amplifier and sensing methods according to various embodiments of the present invention.

FIG. 3 is a circuit diagram of a sense amplifier 300 and sensing methods according to various embodiments of the present invention. Referring to FIG. 3, the sense amplifier 300 is connected to one or more memory cells 110 via a column select circuit 120, as described above with reference to FIG. 1. The sense amplifier 300 includes a plurality of transistors, here field effect transistors, that are interconnected to form a circuit. The circuit may also include other components. The sense amplifier 300 includes a first inverter 310, a first precharging unit 320, a second precharging unit 330, a switching unit 340, a feedback unit 350, and a second inverter 360.

The first inverter 310 receives a sense amplifier enable signal SAE and outputs a bias signal BIAS. The first precharging unit 320 is configured to precharge a first node NA and a second node NB to a power supply voltage VCC in response to a first precharge signal PREA. The first precharging unit 320 includes a first PMOS transistor 321 having a source and a drain that are connected between the power supply voltage VCC and the first node NA and a gate responsive to the first precharge signal PREA, and a second PMOS transistor 322 having a source and a drain that are connected between the power supply voltage VCC and the second node NB and a gate responsive to the first precharge signal PREA.

The second precharging unit 330 is configured to precharge the bias signal BIAS to the power supply voltage VCC in response to a second precharge signal PREB. The second precharging unit 330 includes a PMOS transistor 331 having a source and a drain that are connected between the power supply voltage VCC and a bias signal BIAS and a gate responsive to the second precharge signal PREB.

The switching unit 340 is configured to transfer the voltages of the first and second nodes NA and NB to a data line D/L in response to the bias signal BIAS. The switching unit 340 includes a first NMOS transistor 341 having a source and a drain that are connected between the data line D/L and the first node NA and a gate responsive to the bias signal BIAS, and a second NMOS transistor 342 having a source and a drain that are connected between the data line D/L and the second node NB and a gate responsive to the bias signal BIAS.

The feedback unit 350 is configured to control the voltage of the bias signal BIAS in response to the signal of the data line D/L in order to maintain the voltages of the data line D/L and the bit line B/L uniform. The feedback unit 350 includes an NMOS transistor 351 having a source and a drain that are connected between the bias signal BIAS and a ground voltage VSS and a gate responsive to the data line D/L.

The second inverter 360 is responsive to the signal of the first node NA and is configured to output a sense amplifier output signal SAOUT.

Figure 4:
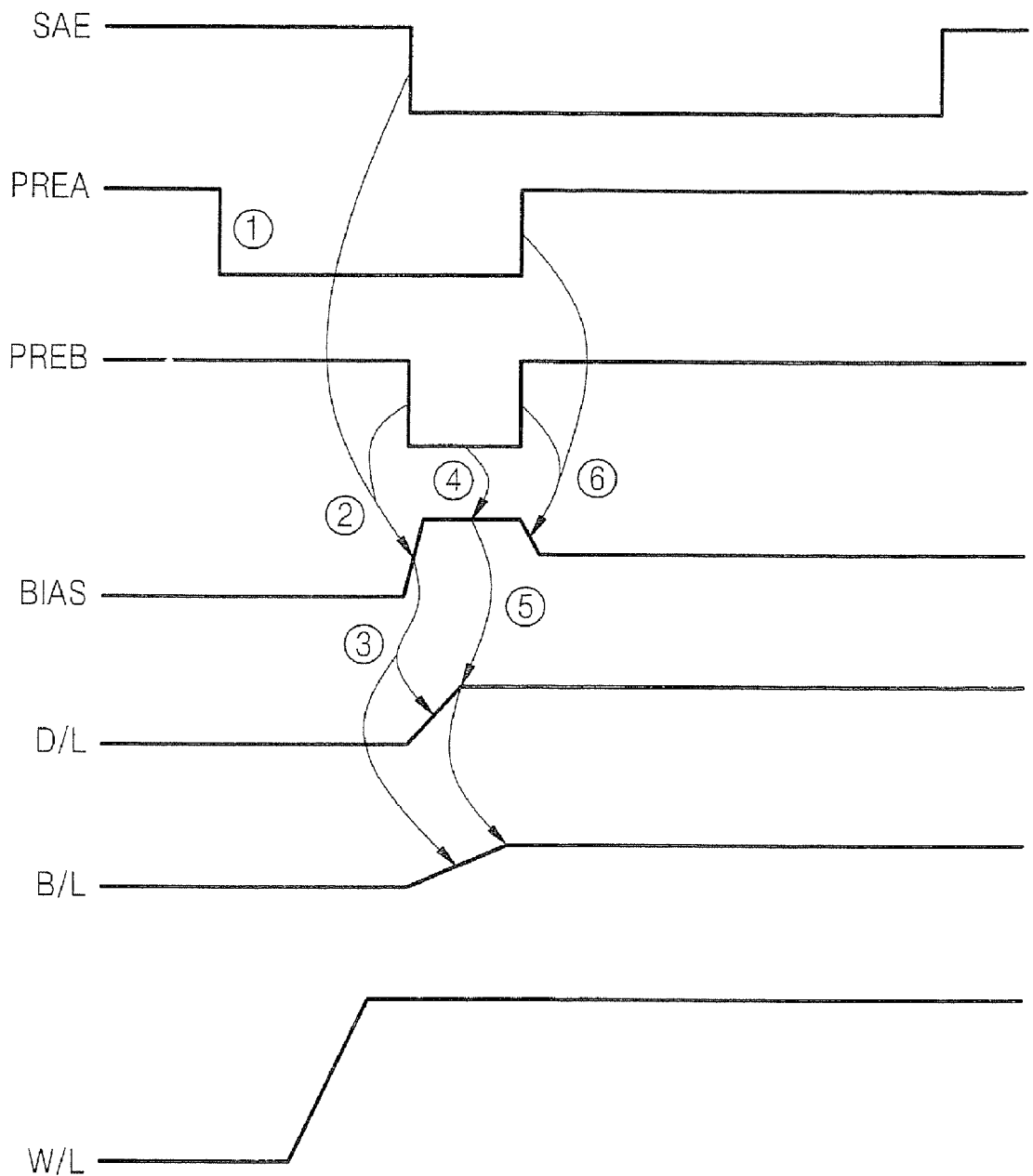
FIG. 4 is a timing diagram of operations of a sense amplifier illustrated in FIG. 3.

The operation of a sense amplifier 300 according to various embodiments of the invention will be explained with reference to FIGS. 3 and 4. FIG. 4 is a timing diagram of operations of a sense amplifier 300.

Referring to FIGS. 3 and 4, the first precharge signal PREA is enabled by transitioning to a logic low level, as shown at ①, and thus the first node NA and the second node NB are precharged to the power supply voltage VCC (not shown in FIG. 4). Then, the sense amplifier enable signal SAE and the second precharge signal PREB are enabled by transitioning to a logic low level, and thus the bias signal BIAS is precharged to a logic high level corresponding to the power supply voltage VOC, as shown at ②. The first and second NMOS transistors 341 and 342 of the switching unit 340 are turned on in response to the bias signal BIAS transitioning to a logic high level to transfer the voltage of the first and second nodes NA and NB, that is, the power supply voltage VCC, to the data line D/L, as shown at ③. Since the data line D/L is connected to the bit line B/L via the column select circuit 120, the voltage of the bit line B/L does not increase to the power voltage VCC due to a load of a plurality of bit lines B/L connected to the column select circuit 120 and remains at a predetermined voltage, for example, 0.6V.

The data line D/L at a logic high level turns on the NMOS transistor 351 of the feedback unit 350 to decrease the voltage of the bias signal BIAS. However, the bias signal BIAS maintains the power supply voltage VCC based on the PMOS transistor 331 of the second precharging unit 330 during a logic low level period of the second precharge signal PREB, as shown at ④. In some embodiments, the sizes of the NMOS transistor 351 of the feedback unit 350 and the PMOS transistor 331 of the second precharging unit 330 can be adjusted to maintain the power supply voltage VCC. The data line D/L is precharged and maintained at a logic high level and the bit line B/L is precharged and maintained at a voltage of approximately 0.6V according to the bias signal BIAS maintained at the power voltage VCC, as shown at ⑤.

When the first and second precharge signals PREA and PREB are disabled by transitioning to a logic high level, the voltage of the bias signal BIAS is slightly decreased by the NMOS transistor 351 of the feedback unit 350, which responds to the logic high level of the data line D/L, as shown at ⑥.

After the data line D/L and the bit line B/L are precharged to sufficiently stabilized voltages, the memory cell 110 connected to an enabled word line W/L is sensed. When the memory cell 110 is an ON cell, the bit line B/L transitions to ground voltage VSS and the data line D/L transitions to a logic low level through the column select circuit 120. The voltage of the data line D/L at a logic low level is transferred to the first node NA through the first NMOS transistor 341 of the switching unit 341 and the sense amplifier output signal SAOUT is output as a logic high level. The sense amplifier output signal SAOUT at a logic high level indicates that the memory cell 110 is an ON cell, that is, the memory cell 110 is programmed as "0".

When the memory cell 110 is an OFF cell, the voltages of the precharged bit line B/L, the precharged data line D/L and the precharged first node NA, that is, 0.6V of the bit line B/L, the logic high level of the data line D/L and the logic high level of the first node NA are maintained. Accordingly, the sense amplifier output signal SAOUT is output as a logic low level. The sense amplifier output signal SAOUT at a logic low level indicates that the memory cell 110 is an OFF cell, that is, the memory cell 110 is programmed as "1".

Therefore, a sense amplifier 300 according to some embodiments of the invention can maintain the voltage of the bias signal BIAS sufficiently high using the second precharging unit 330 in a precharging operation to stably maintain the precharge voltage of the bit line BIL according to the first precharging unit.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A sense amplifier comprising:
   a first inverter that is responsive to a sense amplifier enable signal and is configured to output a bias signal;
   a first precharging unit that is configured to precharge a first node and a second node in response to a first precharge signal;
   a second precharging unit that is configured to precharge the bias signal in to a predetermined bias signal voltage in response to a second precharge signal and to maintain the bias signal at the predetermined bias signal voltage until the second precharge signal is disabled, wherein the second precharging unit comprises a PMOS transistor having a source and a drain that are directly connected between a power supply voltage and the bias signal and a gate directly connected to the second precharge signal;
   a switching unit that is configured to connect the first and second nodes to a data line in response to the bias signal;
   a feedback unit that is configured to control the bias signal to maintain a voltage of the data line and a voltage of a bit line; and
   a second inverter that is responsive to the first node and is configured to output a sense amplifier output signal.

2. The sense amplifier of claim 1, wherein the first precharging unit comprises:
   a first PMOS transistor having a source and a drain that are connected between a power supply voltage and the first node and a gate responsive to the first precharge signal; and
   a second PMOS transistor having a source and a drain that are connected between the power supply voltage and the second node and a gate responsive to the first precharge signal.

3. The sense amplifier of claim 1, wherein the switching unit comprises:
   a first NMOS transistor having a source and a drain that are connected between the data line and the first node and a gate responsive to the bias signal; and
   a second NMOS transistor having a source and a drain that arc connected between the data line and the second node and a gate responsive to the bias signal.

4. The sense amplifier of claim 1, wherein the feedback unit comprises an NMOS transistor having a source and a drain that are connected between the bias signal and a ground voltage and a gate connected to the data line.

5. The sense amplifier of claim 1 in combination with:
   a flash memory cell;
   a bit line connected to the flash memory cell; and
   a column select circuit connecting the bit line to the data line.

6. The sense amplifier of claim 2 in combination with:
   a flash memory cell;
   a bit line connected to the flash memory cell; and
   a column select circuit connecting the bit line to the data line.

7. The sense amplifier of claim 3 in combination with:
   a flash memory cell;
   a bit line connected to the flash memory cell; and
   a column select circuit connecting the bit line to the data line.

8. The sense amplifier of claim 4 in combination with:
   a flash memory cell;
   a bit line connected to the flash memory cell; and
   a column select circuit connecting the bit line to the data line.

* * * * *

UNITED STATES PATENT AND TRADEMARK OFFICE
CERTIFICATE OF CORRECTION

| | | |
|---|---|---|
| PATENT NO. | : 7,495,961 B2 | Page 1 of 1 |
| APPLICATION NO. | : 11/563746 | |
| DATED | : February 24, 2009 | |
| INVENTOR(S) | : Cho et al. | |

It is certified that error appears in the above-identified patent and that said Letters Patent is hereby corrected as shown below:

Column 7, Claim 1, Line 24: Please delete "in" after -- the bias signal --

Signed and Sealed this

Twenty-first Day of April, 2009

JOHN DOLL
*Acting Director of the United States Patent and Trademark Office*